United States Patent [19]

Littlebury et al.

[11] Patent Number: 4,604,744
[45] Date of Patent: Aug. 5, 1986

[54] AUTOMATED CIRCUIT TESTER

[75] Inventors: Hugh Littlebury, Tempe; Mavin Swapp, Mesa, both of Ariz.

[73] Assignee: Motorola Inc., Schaumburg, Ill.

[21] Appl. No.: 656,812

[22] Filed: Oct. 1, 1984

[51] Int. Cl.⁴ .............................................. G01R 31/28
[52] U.S. Cl. ........................................ 371/20; 371/27
[58] Field of Search ............................ 371/20, 27, 25; 324/73 R, 73 AT

[56] References Cited

U.S. PATENT DOCUMENTS

| | | | |
|---|---|---|---|
| 3,969,618 | 7/1976 | Strubel et al. | 371/21 |
| 4,287,594 | 9/1981 | Shirasaka | 371/25 |
| 4,293,950 | 10/1981 | Shimizu et al. | 371/27 X |
| 4,348,759 | 9/1982 | Schnurmann | 371/20 |
| 4,365,334 | 12/1982 | Smith et al. | 371/27 |
| 4,439,858 | 3/1984 | Petersen | 371/20 |
| 4,450,560 | 5/1984 | Conner | 371/25 |
| 4,493,079 | 1/1985 | Hughes, Jr. | 371/27 |
| 4,517,661 | 5/1985 | Graf et al. | 371/27 X |

Primary Examiner—Charles E. Atkinson
Attorney, Agent, or Firm—Jonathan P. Meyer

[57] ABSTRACT

An automated integrated circuit tester is constructed as a state machine. Complete test routines are contained in a state memory. A state generator is controlled by state memory and produces addresses therefor. A complete test condition can be set up using the information in a single address in state memory. Provisions are made for test routine loading from a local computer, which also serves to log data without interfering in test execution. A preferred embodiment provides both DC parametric and AC testing in a tester which can accomodate up to 256 pins. A single force and measure unit is devoted to each pin.

23 Claims, 14 Drawing Figures

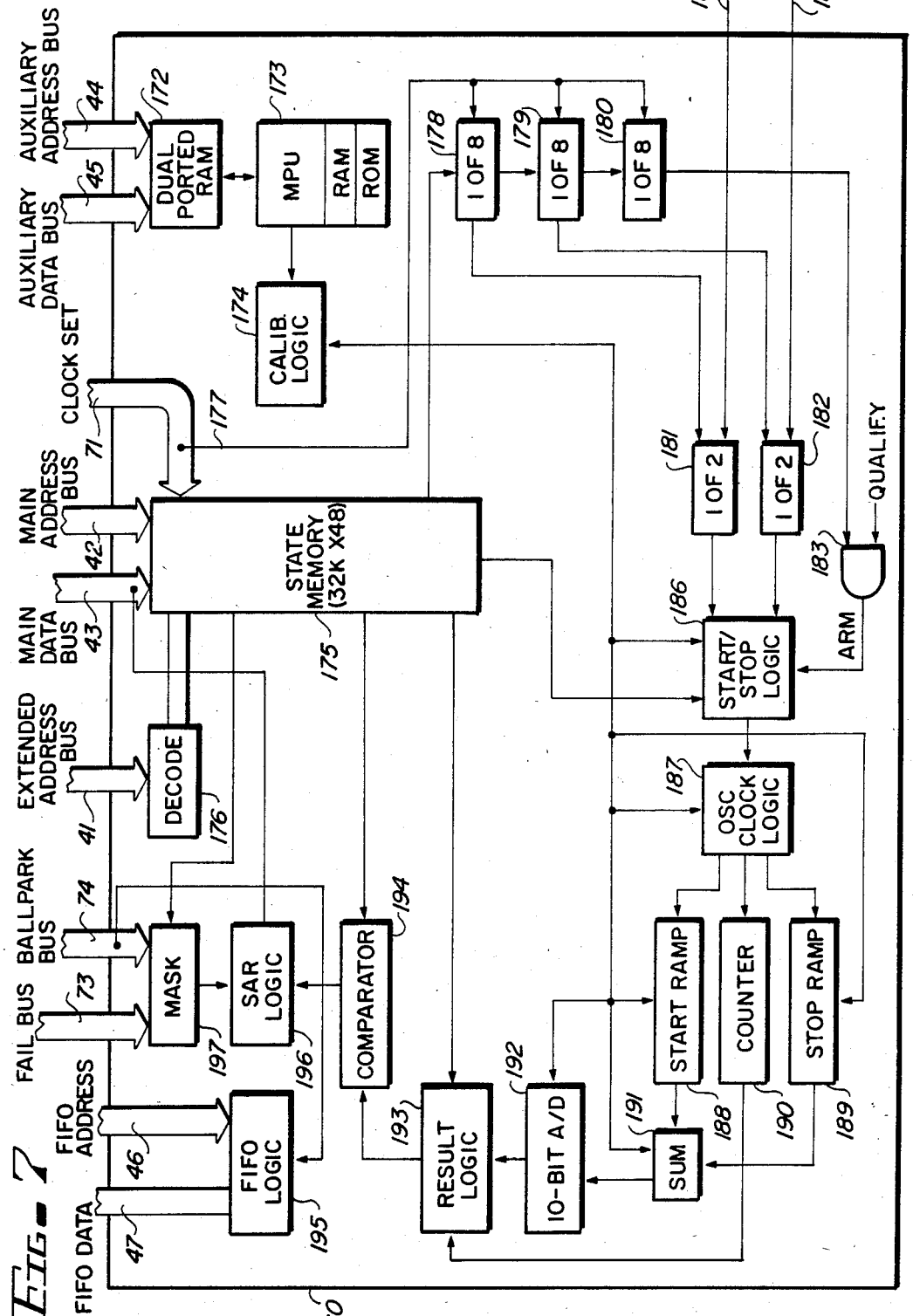

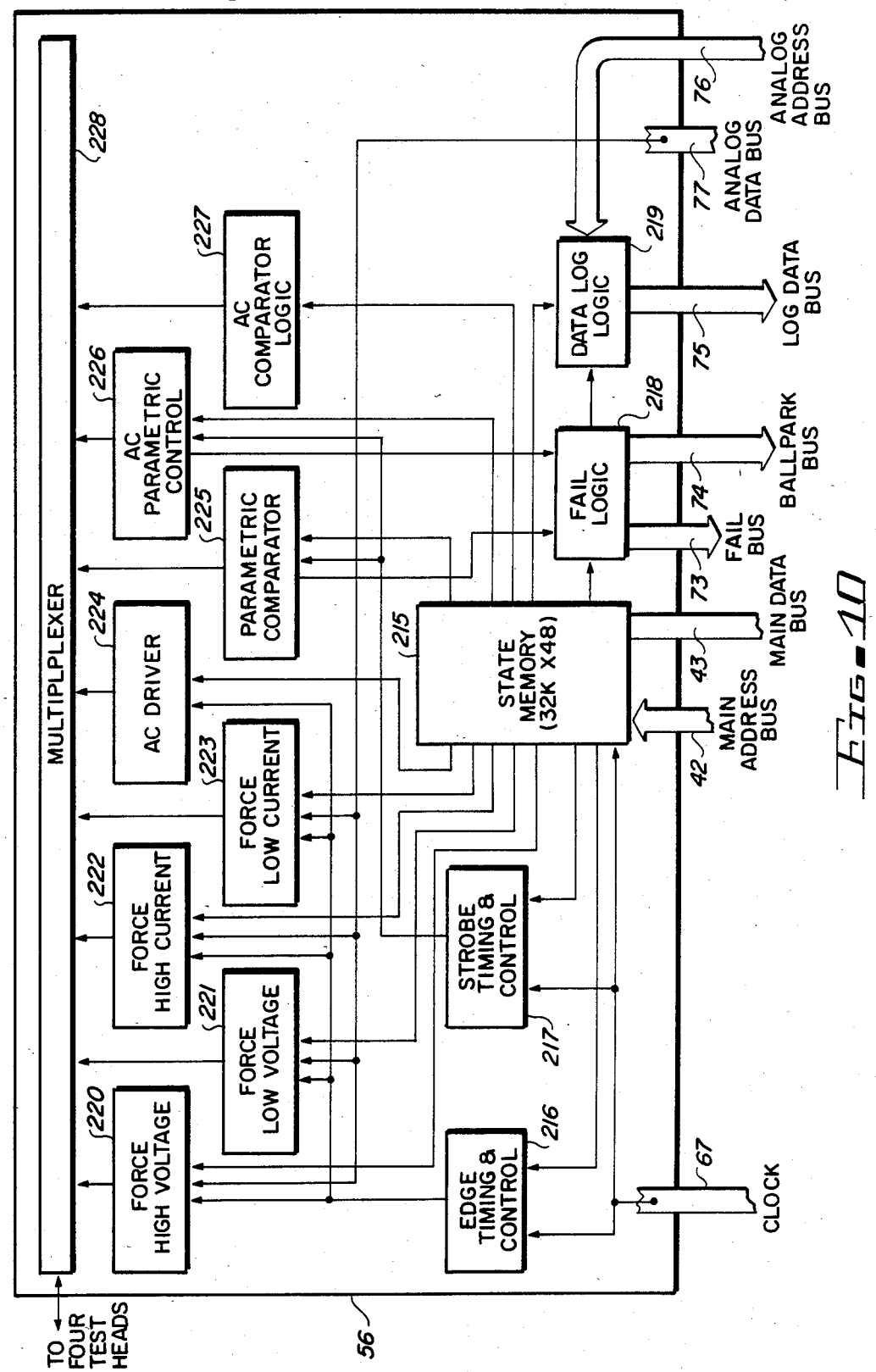

AUTOMATED CIRCUIT TESTER

FIELD OF THE INVENTION

The present invention relates, in general, to automated integrated circuit testers. More particularly, the invention relates to an improved hardware architecture for high speed, multiple pin integrated circuit testers.

BACKGROUND OF THE INVENTION

A crucial step in the manufacturing of integrated circuits is the testing of those circuits after device fabrication. As with each of the steps involved in integrated circuit manufacture, it is advantageous to perform this testing with as little cost as possible. Therefore, high speed, automated integrated circuit testers are necessary.

As integrated circuits become more complex and require more pins for interconnection to circuit boards and the like, the apparatus necessary for testing the integrated circuits becomes much more complex. Early integrated circuit testers used a single force and measure unit which was serially connected to each of the pins to be tested. The force and measure unit applies predetermined forcing conditions of voltage and/or current to the pin and measures the response thereto. More recent automated testers have moved in the direction of multiple force and measure units and have reached the point of dedication of a single force and measure unit to each pin to be tested. Typically, a minicomputer contains the testing and measuring routines and is responsible for managing the testing process.

The speed of the current generation of automated integrated circuit testers is limited by the speed at which the management computer can communicate with all of the force and measure units and associated electronics. Since the amount of information which must be passed from the management computer to the test electronics to specify a given test state and measurement criteria is so large, the communication speed is relatively slow.

SUMMARY OF THE INVENTION

Accordingly, it is an object of the present invention to provide an improved integrated circuit tester.

It is a further object of the present invention to provide a high speed architecture for an automated integrated circuit tester.

These and other objects and advantages of the present invention are provided by an automated integrated circuit tester in which all of the information necessary to run one or more complete test routines is stored in a state memory. A plurality of force and measure units, one for each pin to be tested, are directed by information received from state memory. In addition, a state generator is driven by state memory and by current test results to provide a subsequent address for state memory. The tester thus constructed runs autonomously of a local computer except when test routines are being loaded into state memory. Further, the state memory is configured so that all of the information necessary to specify a force and measure condition of the machine is at a single memory address. This provides for very high speed performance of test routines.

These and other objects and advantages of the present invention will be apparent to ones skilled in the art from the detailed description below taken together with the drawings.

BRIEF DESCRIPTION OF THE DRAWINGS

FIG. 7 is a detailed block diagram illustrating the time-to-digital converter of FIG. 2.

FIG. 10 is detailed block diagram illustrating the force and measure circuits of the force and measure unit of FIG. 2.

DETAILED DESCRIPTION OF THE INVENTION

Figure 1:
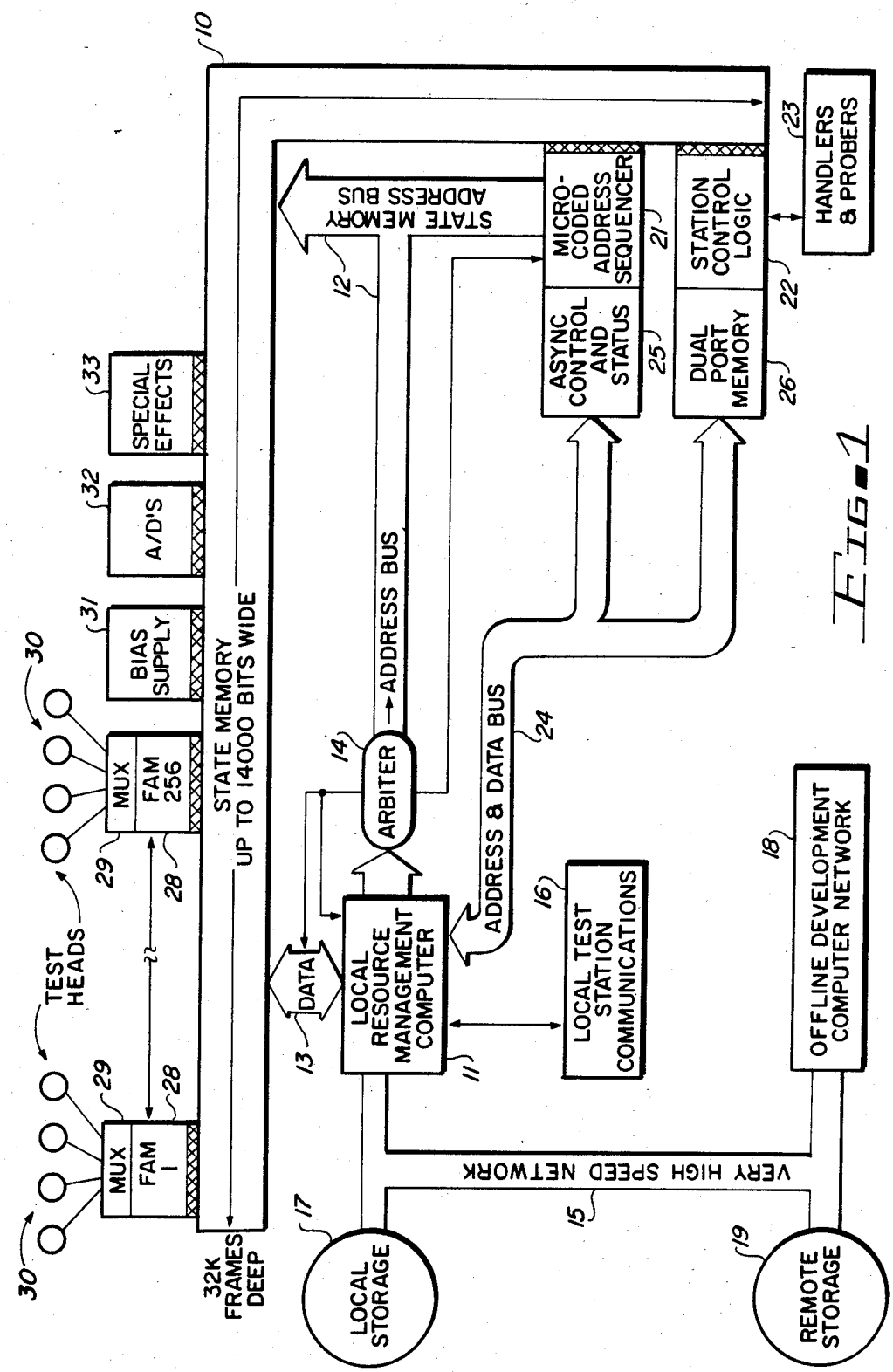
FIG. 1 is a conceptual block diagram illustrating an automated integrated circuit tester according to the principles of the present invention.

FIG. 1 illustrates the present invention at a conceptual level with a block diagram of a particular embodiment thereof. A central feature of the present invention is state memory 10. State memory 10 is an extremely large memory array which, in a particular embodiment of the present invention, is 32,000 words, or "frames", deep and up to 14,000 bits wide. In other words, a single address in state memory 10 contains up to 14,000 bits and state memory 10 includes 32,000 such addresses.

A local computer 11 has access to an address bus 12 and a data bus 13 connected to state memory 10. This access is under the control of an arbiter 14. Local computer 11 is allowed access to buses 12 and 13 only while no testing is occurring. Thus, the speed at which local computer 11 can load test routines into state memory 10 is not a limiting factor on the speed of operation of the tester. Local computer 11 provides communications interface 16 between the tester and the operators. Local computer 11 also includes data storage device 17. Local computer 11 is preferably a node of a high speed network 15 which allows various engineering work stations 18 with their associated storage 19 to have access to local computer 11 for purposes of test routine development, statistical analysis of test results, monitoring of the maintenance of the tester and other functions.

A central feature of the present invention is that all of the subsystems which take part directly in the testing of an integrated circuit are driven by state memory 10. This includes an address sequencer 21 which is connected to address bus 12 and thereby provides the state memory address next to be read by the tester. In this sense, a tester according to the present invention is a state-driven machine.

A station controller 22 is driven by state memory 10 and is coupled to handlers and probers 23 which control the mechanical aspects of coupling integrated circuits to be tested to the tester and binning tested devices.

An address and data bus 24 is connected to local computer 11, to address sequencer 21 by means of asynchronous communications controller 25, and to station controller 22 by means of dual port memory 26. By means of address and data bus 24, local computer 11 is able to monitor the operation of the tester without interfering with its speed.

The application of forcing conditions to the pins of the device under test and the measurement of responses is accomplished by force and measure units 28. Each force and measure unit 28 is connected to state memory 10. In addition, each force and measure unit 28 is coupled to a single pin of a device under test. Due to the great speed of a tester according to the principles of the present invention, it is advantageous to couple up to four test heads 30 to force and measure units 28 by means of multiplexer 29. In other words, each force and measure unit 28 is coupled to one pin at each of four test heads 30. In this manner, the tester need not wait while devices are moved into and out of test heads 30.

Since only a few pins, the power supply pins, of each integrated circuit will require relatively high power and/or high current, it is advantageous to separately connect those pins to bias supply 31. Bias supply 31 is also connected to state memory 10.

By means not shown in FIG. 1, force and measure units 28 provide pass and failure indications for each test to address sequencer 21 and station controller 22. However, this information is sometimes not sufficiently detailed to allow meaningful analysis of problems occurring during the manufacture of the integrated circuits. Therefore, a data logging apparatus 32 is provided which can selectively digitize the actual analog measurements made by force and measure units 28. Preferably, the logged data is communicated to local computer 11 to allow analysis of the data at one or more of engineering work stations 18. This interconnection will be described in greater detail below.

Certain measurements which require special electronics and/or relatively long periods are not advantageously included in the capabilities of force and measure units 28. Therefore, a special measurements apparatus 33 is provided which has the capability of stalling the operation of address sequencer 21 and performing these measurements. Again, this function will be described in greater detail below.

The general scheme of operation of the tester shown in FIG. 1 is as follows: test routines for particular integrated circuits are developed using offline development network 18 and provided to local computer 11 by means of network 15; local computer 11 loads test routines into state memory 10 during periods when no testing is taking place; address sequencer 21 and station controller 22 take control and run the test routines; and local computer 11 monitors the status of the tester and collects logged data while not interfering in actual testing.

In order to succinctly describe the present invention at a conceptual level, FIG. 1 is necessarily somewhat abstract. Certain features of a preferred embodiment of the present invention have been left out for clarity. Therefore, the remainder of the detailed description, which describes a preferred embodiment of the invention, may not be consistent in every detail with FIG. 1.

The design philosophy of the preferred embodiment described below is to provide as flexible a testing tool as possible within the constraints of the basic architecture. Therefore, much of the description below is of the potential uses of the various capabilities provided in the tester. The end user, the test engineer, will determine the actual uses to which the various capabilities of the machine are put.

Figure 2:
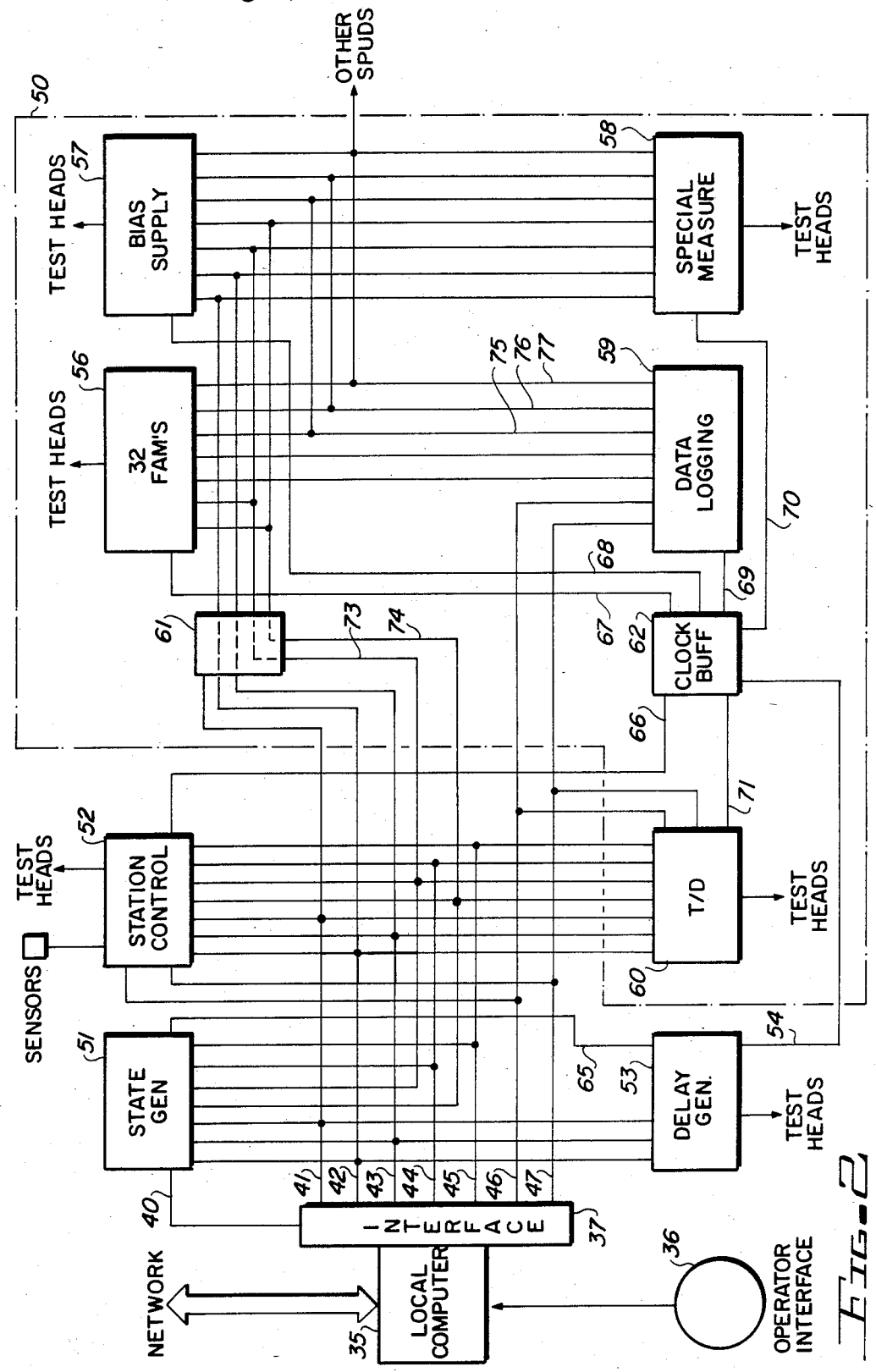
FIG. 2 is a block diagram illustrating the major components and interconnections of a particular embodiment of the present invention.

FIG. 2 is a block diagram illustrating the major components of a preferred embodiment of the present invention and the interconnections therebetween. The "offline" portions of the test apparatus include local computer 35 with its associated network, operator interface 36 coupled to local computer 35 and interface 37 which provides communications between local computer 35 and the "online" portions of the test apparatus. In a preferred embodiment of the present invention local computer 35 is an Apollo DSP 80 available from Apollo Computer Inc. Interface 37 is the Multibus interface which is a part of the DSP 80 (Multibus is a trademark of Intel Corporation). The lines which provide interconnection between interface 37 and the remainder of the test apparatus are: disconnect line 40, extended address bus 41, main address bus 42, main data bus 43, auxiliary address bus 44, auxiliary data bus 45, FIFO address bus 46 and FIFO data bus 47. The functions of these lines will be described in detail with reference to FIG. 3, below.

For a number of reasons, a tester according to a preferred embodiment of the present invention is broken down into a number of "spuds" 50. Each spud 50 contains the basic electronics necessary to perform force and measure, bias supply, special measurements, data logging and time interval measurement functions for 32 pins of a device under test. Up to eight spuds 50 can comprise the entire tester, thus allowing for up to 256 pins. However, this basic architecture can be readily expanded to beyond 256 pins.

Three basic components of a test apparatus according to the preferred embodiment serve all of the spuds 50. These are: state generator 51, station controller 52 and delay generator 53. State generator 51 is the address sequencer which, on the basis of information stored in the current location in state memory and the results of the current test, determines the next location in state memory to be executed. Station controller 52 controls the device handlers and probers, monitors the physical condition of the tester, provides basic statistical result information to the operator interface and provides certain branching information to state generator 51. Delay generator 53 provides the basic timing information to the entire test apparatus by means of a master clock line 54. In addition, delay generator 53 is coupled to the test heads to allow it to respond to external clock pulses therefrom.

Each spud 50 comprises 32 force and measure units 56, each dedicated to a particular pin; a bias supply apparatus 57; a special measurements apparatus 58; a data logging apparatus 59; a time to digital converter 60, which provides digital measurements of time intervals; a spud buffer 61, which buffers communication between each spud 50 and the remainder of the test apparatus; and a clock buffer 62 which serves to distribute timing signals from delay generator 53 to each of the components of the test apparatus and to equalize path length delays therebetween.

A state generator clock line 65 provides clock signals from delay generator 53 to state generator 51. The remainder of the clock signals are all distributed from clock buffer 62. Line 66 connects clock buffer 62 to station controller 52. Line 67 connects clock buffer 62 to the 32 force and measure units 56 of spud 50. Line 68 connects clock buffer 62 to bias supply 57. Line 69 connects clock buffer 62 to data logging apparatus 59. Line 70 connects clock buffer 62 to special measurements apparatus 58. Line 71 connects clock buffer 52 to time-to-digital converter 60.

Indications of whether particular measurement criteria were passed or failed by particular pins of the device under test are supplied by force and measure units 56 to a fail bus 73 and a ballpark bus 74. Fail bus 73 is used to indicate test failures. Ballpark bus 74 is used to indicate near failures and/or near passes. Fail bus 73 and ballpark bus 74 are connected to force and measure units 56, bias supply 57, special measurements apparatus 58, and, through spud buffer 61, to station controller 52, time-to-digital converter 60 and state generator 51.

A log data bus 75 connects force and measure units 56, bias supplies 57, special measurements apparatus 58 and data logging apparatus 59. Log data bus 75 is used to request the digitization of particular analog test results by data logging apparatus 59.

An analog address bus 76 and an analog data bus 77 connect force and measure units 56, bias supply 57, special measurements apparatus 58 and data logging apparatus 59. Analog buses 76 and 77 are used to pass analog values corresponding to test results among the several subsystems of spud 50. In addition, analog data bus 77 is coupled between the several spuds which comprise the test apparatus and provides the only direct communication therebetween.

The detailed functions and interconnections of each of the subsystems shown in FIG. 2 are described in detail with reference to FIGS. 3-14, below. Like reference numerals indicate like structures throughout FIGS. 2-14.

Figure 3:
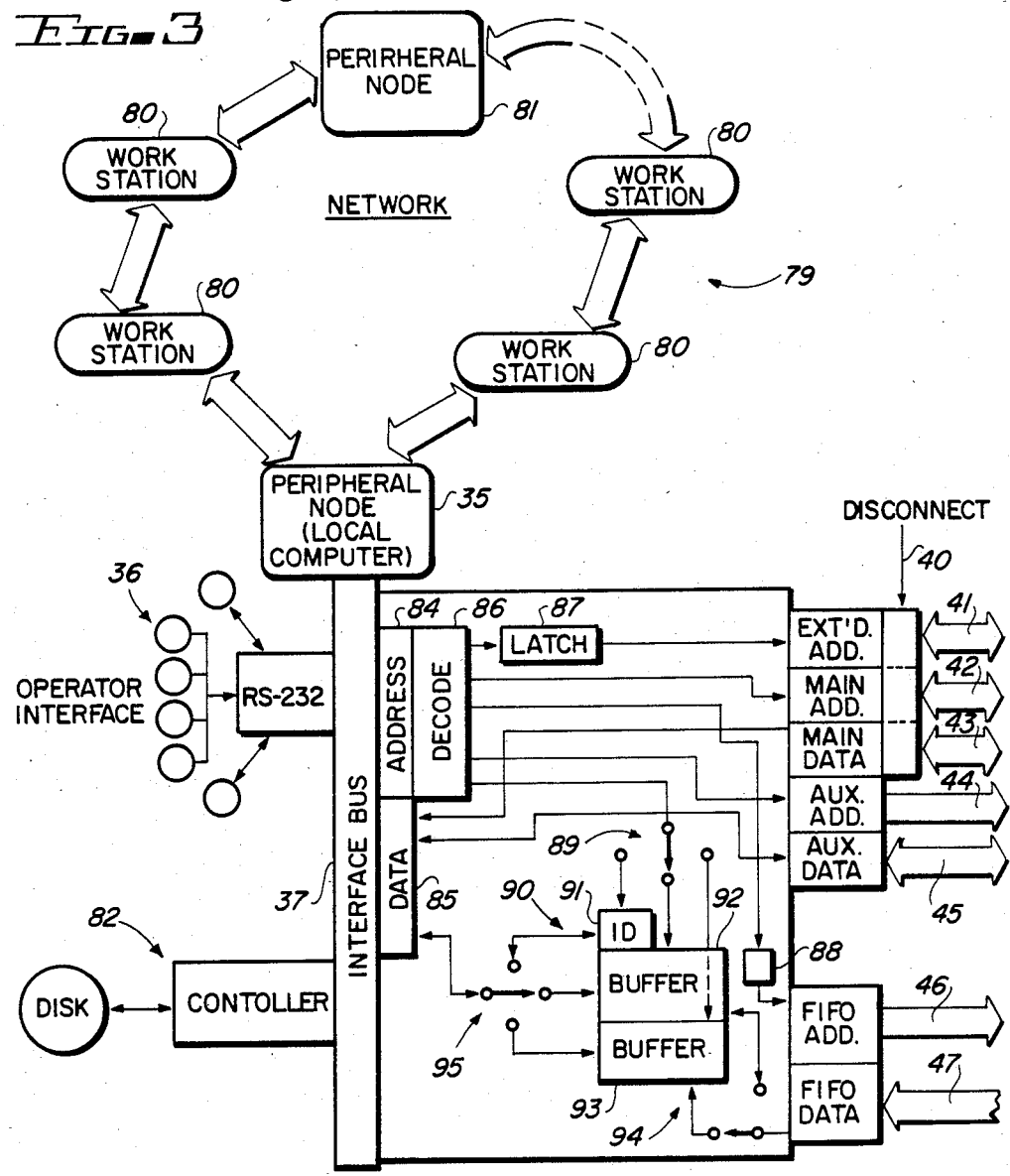
FIG. 3 is a detailed block diagram illustrating the local computer and associated electronics of FIG. 2.

FIG. 3 is a detailed block diagram illustrating the local computer and interface portion of FIG. 2. Local computer 35 is a peripheral node of a network 79. That is, local computer 35 is intended to provide interface to various peripherals. In a preferred embodiment of the present invention, local computer 35 is an Apollo DSP 80 available from Apollo Computer Inc. Network 79 may comprise, for instance, a number of work stations 80 and other peripheral nodes 81. In the preferred embodiment, work stations 80 are Apollo DN 300 computers available from Apollo Computer Inc. Functions such as test routine development, statistical analysis of logged data and monitoring of the state of each tester on the network can be performed at work stations 80.

Local computer 35 provides interface bus 37 to which operator interface 36, mass storage 82 and interface board 83 are connected. In the preferred embodiment, interface bus 37 is the well known Multibus. (Multibus is a trademark of Intel Corporation.) Operator interface 36 provides the means by which the tester operators can monitor the function of the tester and provide input thereto. Mass storage 82 provides a means by which test routines, logged data and other information can be stored locally. Of course, this information may also be stored elsewhere on network 79 and accessed by local computer 35.

Interface board 83 provides the means by which the "online" portions of the tester are interfaced to interface bus 37. Interface bus 37 includes an address portion 84 and a data portion 85. Decode logic 86, which is connected to address portion 84, is used to allocate the various address lines available.

Extended address bus 41 is used to select one of the up to eight spuds connected to the tester and is coupled to decode logic 86 by means of latch 87. Main address bus 42 is the state memory address bus and is driven by local computer 35 during program loading and by state generator 51 (FIG. 2) during testing, and it is coupled to decode logic 86. Auxiliary address bus 44 is the address portion of a bus which allows local computer 35 to monitor the tester during testing and it is coupled to decode logic 36. FIFO address bus 46 is the address portion of the bus which communicates logged data from data logging apparatus 59 (FIG. 2) to local computer 35 and it is coupled through scan logic 88 to decode logic 86. Finally, decode logic 86 is coupled through switch 89 to buffer apparatus 90.

Buffer apparatus 90, comprising an ID ROM 91, first buffer 92 and second buffer 93 serves to buffer FIFO data between FIFO data bus 47 and data portion 85 of interface bus 37. Buffer apparatus 90 is connected between FIFO data bus 47 and data portion 85 of interface bus 37 by means of switches 94 and 95. ID ROM 91 is used in conjunction with a process by which each board in the entire tester is uniquely identifiable by local computer 35. This is useful for maintenance purposes among others.

Auxiliary data bus 45 is the data portion of the bus which allows local computer 35 to monitor the operation of the tester and it is connected directly to data portion 85 of interface bus 37. Similarly, main data bus 43, which is the state memory data bus, is connected to data portion 85.

Disconnect line 40, which is connected to state generator 51 (FIG. 2), serves to control access of local computer 35 to extended address bus 41, main address bus 42 and main data bus 43. Disconnect line 40 cuts off access of local computer 35 to extended address bus 41, main address bus 42 and main data bus 43 during testing.

Local computer 35 retains access to auxiliary address bus 44 and auxiliary data bus 45 during testing to monitor tester status and perform other functions. In addition, local computer 35 retains access to FIFO address and data buses 46 and 47 to receive digitized versions of those selected measurements which are logged by the data logging apparatus.

Figure 4:
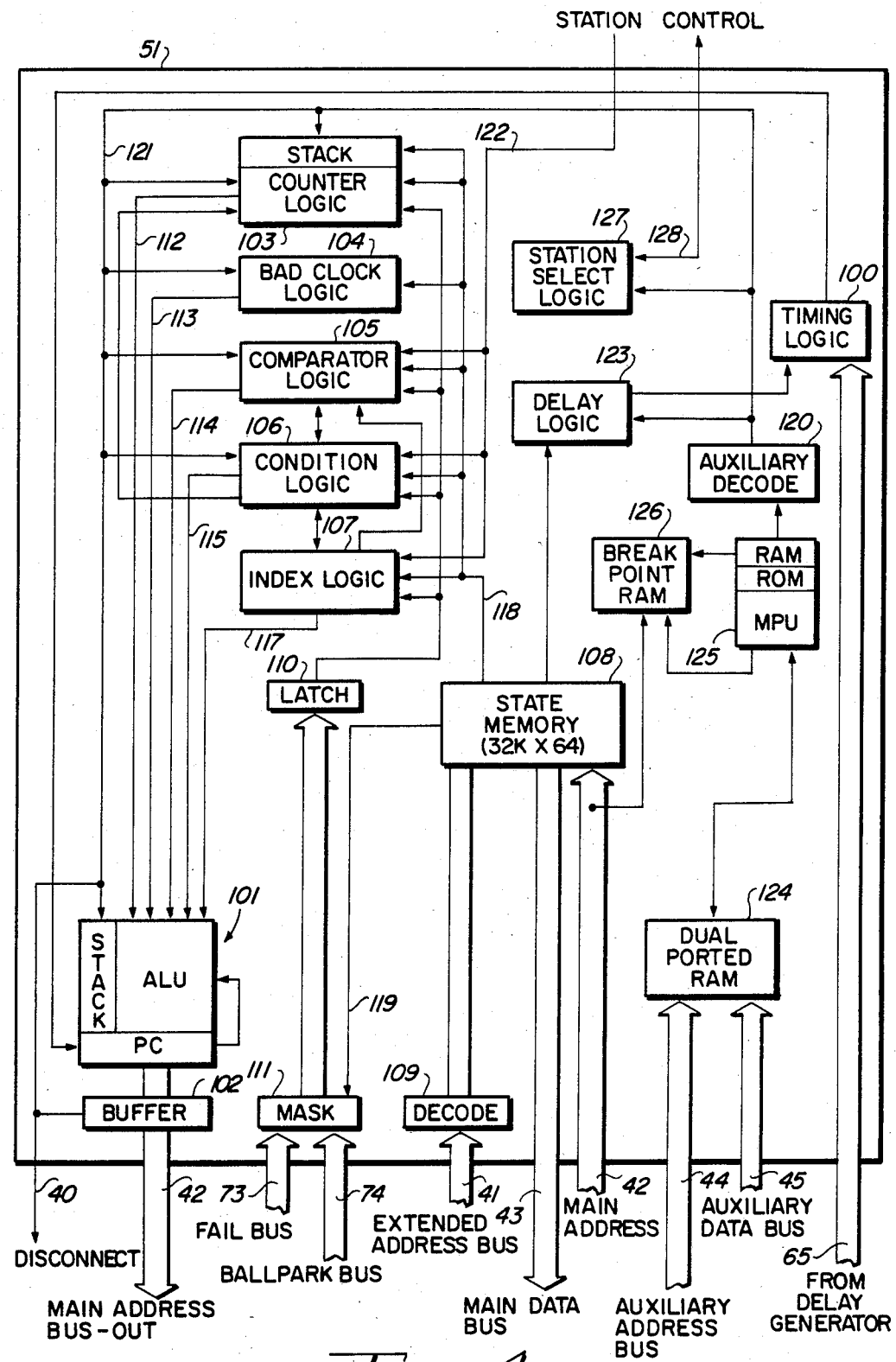
FIG. 4 is a detailed block diagram illustrating the state generator of FIG. 2.

Referring now to FIG. 4, the detailed structure of state generator 51 is discussed. Line 65 from the delay generator carries clock signals to timing logic 100. In turn, timing logic 100 passes timing signals to the program counter portion of address sequencer 101. Address sequencer 101 is coupled though buffer 102 to main address bus 42. Address sequencer 101 produces addresses for state memory during actual testing. In addition, disconnect line 40 is connected to buffer 102.

A number of logic systems are used to monitor the current state of the tester and to control branching of address sequencer 101 to various points in the test routines. Counter logic 103 provides an input to the ALU portion of address sequencer 101 on line 112. Bad clock logic 104 provides an input to the ALU portion on line 113. Comparator logic 105 provides an input to the ALU portion on line 114. Condition logic 106 provides an input to the ALU portion on line 115. Index logic 106 provides an input to the ALU portion on line 117.

Line 118 provides an input from state memory 108 to counter logic 103, bad clock logic 104, comparator logic 105, condition logic 106 and index logic 107. Counter logic 103, comparator logic 105, condition logic 106 and index logic 107 are coupled to fail bus 73 and ballpark bus 74 through latch 110 and mask 111. Mask 111 receives an input from state memory 108 on line 119. Counter logic 103, bad clock logic 104, comparator logic 105, condition logic 106 and index logic 107 each receive an input from an auxiliary decode logic device 120 on line 121. Line 121 also provides an input to the stack portion of address sequencer 101 and is connected to disconnect line 40. Finally, comparator logic 105, condition logic 106 and index logic 107 receive an input from the station controller 52 (FIG. 2) on line 122.

State memory 108 is that portion of the overall state memory which is dedicated to state generator 51. State memory 108 is connected to main address bus 42 and main data bus 43. In addition, state memory 108 is coupled to extended address bus 41 through decoder 109. State memory 108 provides an input to delay logic 123 which, in turn, provides an input to timing logic 100.

Auxiliary address bus 44 and auxiliary data bus 45 are connected to a dual ported ram 124. Dual ported ram 124 is connected in turn to a microprocessor 125. A breakpoint ram 126 is connected to MPU 125 and to main address bus 42. MPU 125 provides input to auxiliary decode 120. Line 121 from auxiliary decode 120 is also coupled to delay logic 123 and a station select logic 127. Station select logic 127 is connected via line 128 to station controller 52 (FIG. 2).

The function of dual ported RAM 124, MPU 125, breakpoint RAM 126 and auxiliary decode logic 120 is fundamentally diagnostic. MPU 125 can read and modify each of the logic elements to which it is connected through auxiliary decode 120. The local computer (FIG. 2) and its operator interface are provided access to the information generated by MPU 125 by means of dual ported RAM 124. Breakpoint RAM 126 allows MPU 125 to identify a predetermined condition of the tester, such as a particular address in state memory, and halt the tester at that point to allow diagnosis of the machine state, for instance.

Timing logic 100 receives timing signals from delay generator 53 (FIG. 2) and distributes them to address sequencer 101. Since state generator 51 is responsible for responding to the test routine and to the results of the previous measurement in determining the next state memory address, it is sometimes necessary to insert delay in the master clock signal to allow state generator 51 to complete its decision-making process. Delay logic 123 responds to its input from state memory 108 and instructs timing logic 100 to insert the necessary delay. In some cases, it may also be necessary to stall delay generator 53 (FIG. 2) temporarily.

Station select logic 127 receives an input from station controller 52 indicating that a particular test head is prepared to perform a test. Station select logic 127 selects a station, or test head, to receive a test and returns this selection to station controller 52 (FIG. 2) via line 128.

Counter logic 103 is used by address sequencer 101 to keep track of the repetition of portions of the test routines, either loops or single statements. The stack associated with counter logic 103 is used to store counts when branching to subroutines.

Bad clock logic 104 is used when the tester is running on an external clock; for instance, when testing a microprocessor. A failure of this external clock would be catastrophic were it not for bad clock logic 104, which waits a set period before identifying the external clock as faulty and returning the tester to its own internal clock or taking other appropriate recovery action.

Comparator logic 105 is preferably an 8-bit comparator. It is used to compare a value received from state memory 108 to some other value. The other value may be passed from index logic 107, condition logic 106, fail bus 73, ballpark bus 74 or any other desired location. The output of comparator logic 105 is used by address sequencer 101 to make branching decisions. In other words, comparator logic 105 is a general purpose comparator available for use to control branching within the test routine.

Condition logic 106 is the flag used by address sequencer 101 to determine if a branching condition has been satisfied. For instance, if comparator logic 105 performs a comparison and a branch is mandated by the result, a bit in condition logic 106 is set. When condition logic 106 is checked by address sequencer 101 and the flag is found to be set, the appropriate branch will be executed. Index logic 107 is used to indicate the current category into which a device being tested is placed. In the preferred embodiment, sixteen "good", or passing, categories are provided. Typically, each "good" category will have different pass limits for a given test. The state of index logic 107 is used by address sequencer 101 as an indirect addressing index. Thus, a particular sequence of code describing a test routine need not be repeated for each "good" category with different pass limits. Instead, the value from index logic 107 is used to indicate the location of the pass criteria to be used by the test sequence, for instance. Of course, the test routine may make use of the contents of index logic 107 in other ways as well.

Mask 111 is used to mask selected portions of fail bus 73 and ballpark bus 74 from having an effect on the branching of address sequencer 101. This is necessary because other portions of the tester occasionally use portions of those buses for purposes other than indicating failures.

Buffer 102 is used to disconnect address sequencer 101 from main address bus 42 while local computer 35 (FIG. 2) has access thereto.

Figure 5:
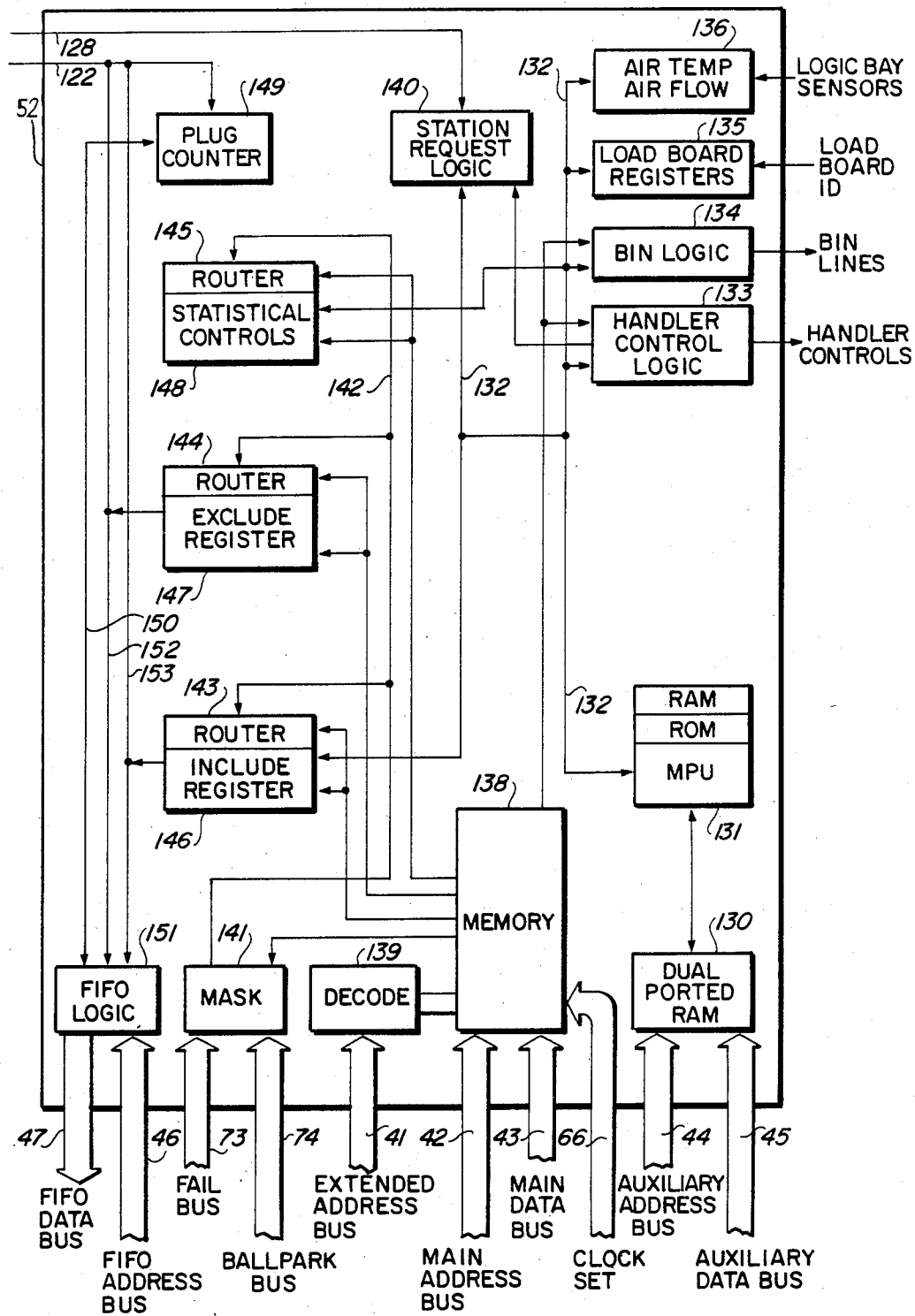
FIG. 5 is a detailed block diagram illustrating the station controller of FIG. 2.

FIG. 5 is a detailed block diagram illustrating station controller 52 of FIG. 2. Auxiliary address bus 44 and auxiliary data bus 45 are connected to dual ported ram 130. In turn, dual ported ram 130 is connected to an MPU 131. MPU 131 is connected on line 132 to a handler control logic 133, bin logic 134, load board registers 135, air temperature and air flow sensors 136, station request logic 140, statistical controls 148 and include register 146. Handler control logic 133 is coupled to the device handlers at the test head. Bin logic 134 is connected to the lines which control the bins for passed and failed parts. Load board registers 135 are coupled to the load board ID at the test heads. Air temperature and air flow logic 136 are coupled to sensors in the logic bay.

State memory 138 contains the portion of state memory dedicated to station controller 52. State memory 138 is connected to main address bus 42, main data bus 43, clock set line 66 and, through decode logic 139 to extended address bus 41. State memory 138 provides inputs to handler control logic 133, bin logic 134, statistical controls 148, exclude register 147 and include register 146.

Station request logic 140 is connected via line 132 to MPU 131 and via line 128 to the state generator 51 (FIG. 2). In addition, station request logic 140 is connected to handler control logic 133.

Fail bus 73 and ballpark bus 74 are connected to mask 141, which also receives an input from state memory 138. Line 142 from mask 141 provides inputs to routers 143, 144 and 145. Routers 143, 144 and 145 are coupled to include register 146, exclude register 147 and statistical controls 148, respectively. Include register 146 is connected to line 132 from MPU 131. Include register 146 and router 143 are connected to state memory 138. Exclude register 147 and router 144 are connected to state memory 138. Statistical controls 148 is connected to line 132 from MPU 131. Statistical controls 148 and router 145 are connected to state memory 138.

Plug counter 149 is connected to the state generator 51 (FIG. 2) via line 122. Plug counter 149 provides an output via line 150 to FIFO logic 151. FIFO logic 151 also receives a combined input from line 122 and exclude register 147 on line 152. FIFO logic 151 further receives a combined input from line 122 and include register 146 on line 153. FIFO logic 151 is connected to FIFO address bus 46 and FIFO data bus 47.

MPU 131 serves to interface the relatively slow mechanical handlers and probers to the fast tester and to perform other functions. Once a device has been fully tested and a bin assigned, MPU 131 frees the tester to continue with other test heads while the device is marked or binned and the next device is probed or inserted. The bin logic and the handler control logic are the interfaces between MPU 131 and those devices.

MPU 131 also provides information on test results to the operator interface by means of dual ported RAM 130. Statistical information is provided through MPU 131 by statistical controls 148. Statistical controls 148 is a tool available under control of the test routine in state memory 138 to provide some limited analytical capability of critical parameters at the operator console. Since the logged data on the FIFO bus requires substantial decoding and analysis, some simple, real-time analysis is useful to provide more timely feedback. Statistical controls 148 may be set to monitor up to eight critical parameters, for instance. The operator may chose to display this information at the console. Also, MPU 131 may monitor these parameters and compare to an alarm level.

Air flow and air temperature senors 136 monitor the cooling of the main tester cabinet and provide warning signals or shut down the test, as appropriate, through MPU 131.

Load board registers 135 provide a means by which the load board is identified to the tester at load time, when the test routine is being loaded. The load board is the hardware necessary to interface a particular device to the general purpose tester. Thus, MPU 131 can check load board registers 135 to determine if the program being loaded into state memory is appropriate for the hardware present in the system. Furthermore, the load board ID's contained in load board registers 135 provide the system software with information about the pin-out.

Station request logic 140 is a set of latches which hold valid requests for tests. The requests are received from handler control logic 133 and held for reading by station select logic 127 (FIG. 4).

Plug counter 149 serves to separate data on FIFO data bus 47. Since up to eight spuds, each having a data logging board, may be part of each tester, and since the data logging is taking place assynchronously with respect to the clocking of state memory, the data on FIFO bus 147 is somewhat jumbled. Plug counter 149 controls the insertion into the data stream on FIFO bus 47 of "plugs" which serve to separate and identify the many measurements appearing on the bus. An off-line computer can, at a later time, re-order the information stored from the data logging apparatus using the information in the "plugs".

Exclude register 147 contains information on the current category of each of the parts being tested. Each new part starts "included" in each of the sixteen "good" categories. As the test criteria for a particular category are failed, the appropriate bits in exclude register 147 are altered to indicate that the part has been downgraded, or "excluded" from that category.

Include register 146 is similar, but relates to the gathering of particular failure data. Include register 146 provides sixty four categories available to the designer of the test routines. Each time a particular test criteria is failed, the test routine may alter the contents of include register 146 to provide failure data in the output data stream. The binning of the part is not determined by the contents of include register 146, it simply provides more failure data for analysis.

Routers 143, 144 and 145 are responsible for routing failure data to the appropriate locations in include register 146, exclude register 147 and statistical controls 148.

Figure 6:
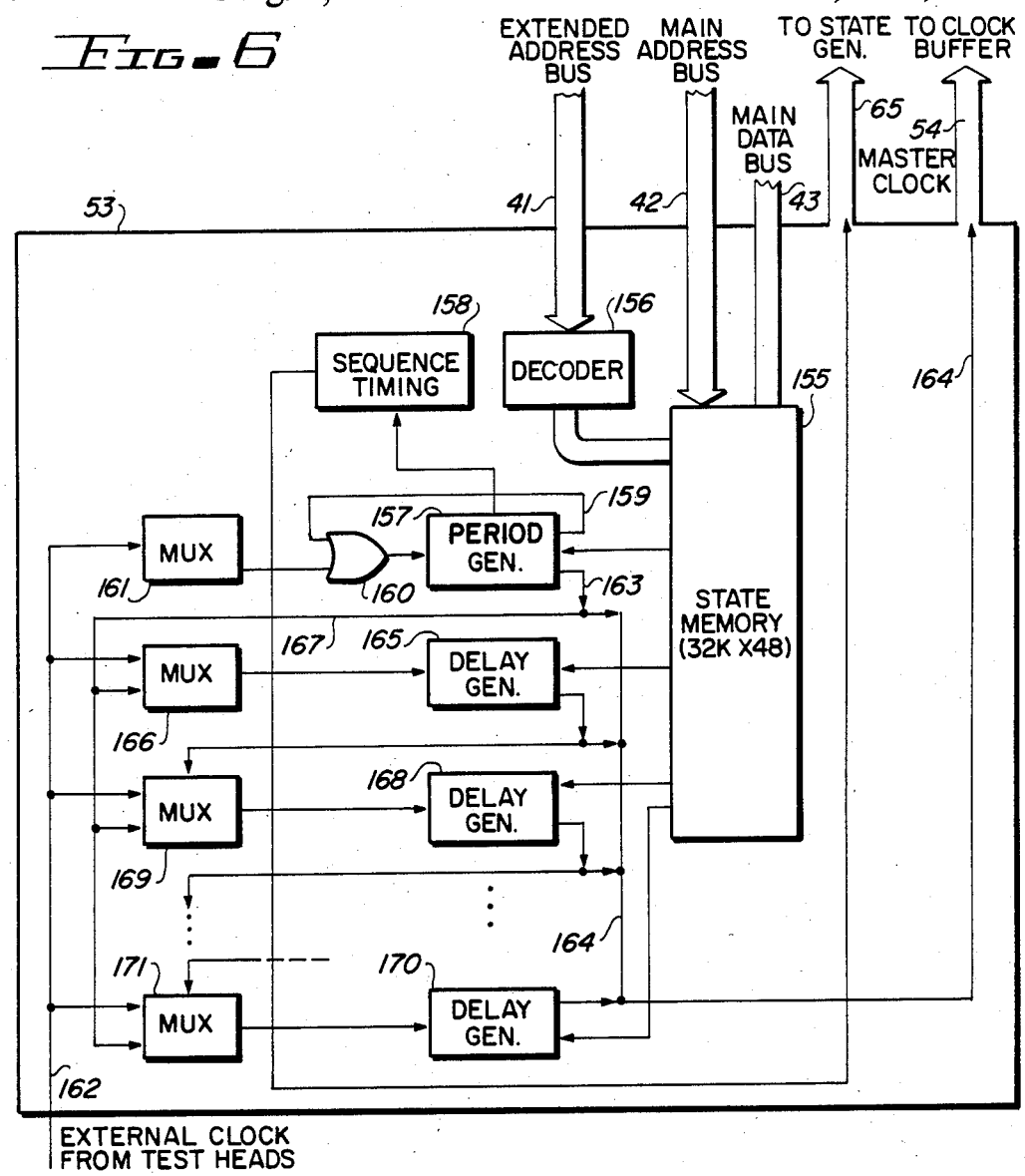
FIG. 6 is a detailed block diagram illustrating the delay generator of FIG. 2.

FIG. 6 is a detailed block diagram illustrating delay generator 53 of FIG. 2. State memory 155, which contains the portion of state memory dedicated to delay generator 53, is connected to main address bus 42, main data bus 43 and, through decode logic 156, to extended address bus 41. State memory 155 provides an input to period generator 157. Period generator 157 produces an input to sequence timing logic 158. The output of sequence timing logic 158 is connected to line 65, which provides a timing signal to the state generator 51 (FIG. 2).

Output 159 of period generator 157 is connected to one input of NOR gate 160. The other input of NOR gate 160 is connected to the output of multiplexer 161. The output of NOR gate 160 is connected to period generator 157. Line 162 from the test heads is provided in case it is desirable to base the tester timing on an external clock. Line 162 is connected to multiplexer 161.

Output 163 of period generator 157 comprises a first clock signal and is connected to clock output line 164. Clock output line 164 is connected to master clock line 54 which distributes the master clock signals to clock buffer 62 (FIG. 2).

A second clock signal is produced by a first delay generator 165 and connected to clock output line 164. First delay generator 165 has an input connected to state memory 155 and an input connected to multiplexer 166. Multiplexer 166 has an input connected to external clock line 162 and an input connected to output 163 of period generator 157 via line 167.

A third clock signal is produced by second delay generator 168 and connected to clock output line 164. Second delay generator 168 has an input connected to state memory 155 and an input connected to multiplexer 169. Multiplexer 169 has inputs connected to external clock line 162, first clock signal line 167 and the output of first delay generator 165.

The chain of delay generators described above continues up through eighth delay generator 170 which produces a ninth clock signal which is connected to clock output line 164. Eighth delay generator 170 has an input connected to state memory 155 and an input connected to multiplexer 171. Multiplexer 171 has inputs connected to external clock line 162, first clock signal line 167 and the output of the seventh delay generator which is not shown in FIG. 6.

Period generator 157 provides the basic timing signal for the system based on its own clock or on an external clock input through multiplexer 161 and NOR gate 160. Period generator 157 also provides the input to sequence timing logic 158, which provides the basic timing signals to state generator 51 (FIG. 2). As noted above, state generator 51 requires special timing signals because it must determine the next state address prior to the clock signal which indicates to the remainder of the tester that the address is valid.

Each delay generator simply produces a timing signal, an edge, at a certain delay after the first clock edge. Thus, eight different delays, the value of each specified from state memory, are available to time various events in the system.

FIG. 7 is a detailed block diagram illustrating time-to-digital converter 60 of FIG. 2. State memory 175, which contains the portion of state memory dedicated to time-to-digital converter 60, is connected to main address bus 42, main data bus 43 and, through decode logic 176, to extended address bus 41. In addition, clock set line 71 from clock buffer 62 (FIG. 2) is connected to state memory 175. Line 177 provides the clock signal from clock set line 71 to three one of eight selectors 178, 179 and 180. One of eight selectors 178, 179 and 180 are also connected to state memory 175.

First one of eight selector 178 provides an input to one of two selector 181. Second one of eight selector 179 provides an input to one of two selector 182. Third one of eight selector 180 provides an input to AND gate 183. Start line 184 from the test heads provides another input to one of two selector 181. Stop line 185 from the test heads provides another input to one of two selector 182. One of two selector 181 provides a start signal to start-stop logic 186. One of two selector 182 provides a stop signal to start-stop logic 186. AND gate 183, which has a second input comprising a qualify signal, provides a third input to start-stop logic 186. Start-stop logic 186 is also connected to state memory 175.

Oscillator clock logic 187 receives inputs from state memory 175 and start-stop logic 186. Oscillator clock logic 187 provides inputs to start ramp 188, stop ramp 189 and counter 190. Sum circuit 191 receives inputs start ramp 188 and stop ramp 189. The output of sum circuit 191 is connected to a 10 bit A-to-D converter 192. The output of A-to-D converter 192 is connected to result logic 193, which also receives inputs from state memory 175 and counter 190.

The output of result logic 193 is connected to comparator 194, which also receives an input from state memory 175. The output of comparator 194 is connected to FIFO logic 195, which is also connected to FIFO address bus 46 and FIFO data bus 47.

The output of comparator 194 is also connected to successive approximation logic 196. Successive approximation logic 196 also receives an input from mask 197, which is connected to fail bus 73 and ballpark bus 74.

The output of successive approximation logic 196 is connected to main data bus 43. The output of comparator 194 is also connected to ballpark bus 74.

An internal calibration system is provided for time-to-digital converter 60. A dual ported RAM 172 is connected to auxiliary address bus 44 and auxiliary data bus 45. An MPU 173 is connected to dual ported RAM 172 and to a calibration logic 174. Calibration logic is connected to start/stop logic 186, oscillator-clock logic 187, start ramp 188, stop ramp 189, sum circuit 191 and A-to-D converter 192. Since MPU 173 is not controlled by state memory 175, calibration is done while time-to-digital board 60 is not in use.

First one-of-eight selector 178 selects, under control of state memory 175, one of the eight clock signals on line 71 to be used as a start signal. Second one of eight selector 179 similarly selects a stop signal from line 71. Third one of eight selector 180 selects a qualify signal.

First one of two selector 181 selects either the signal from one of eight selector 178 or the external signal from the test head on line 184 as the start signal. Second one of two selector 182 similarly selects either the signal from one of eight selector 179 or the signal on line 185 as the stop signal.

Start/stop logic 186 is armed by an input from AND gate 183. This provides a means for selecting which of the myriad edges present in the timing system are to be triggered on. Start/stop logic 186 triggers oscillator clock logic 187. Oscillator clock logic 187 provides inputs to start ramp 188 and stop ramp 189, which have been calibrated through calibration logic 174. The analog signal produced by sum circuit 191, which sums the outputs of start ramp 188 and stop ramp 189, is digitized by A-to-D converter 192. This result is passed to result logic 193 along with the contents of counter 190.

The output of result logic 193, which is the digitized time interval measurement, is passed to comparator 194 for comparison to a value received from state memory 175. The result of this comparison may be passed to FIFO logic 195, for instance, if it is desired to simply output the interval measurement.

Time-to-digital board 60 may also be used to calibrate the various delays present throughout the tester. In this case, the output of comparator 194 is passed to successive approximation logic 196, which adjusts the value of the register which is determining the delay being calibrated.

Figure 8:
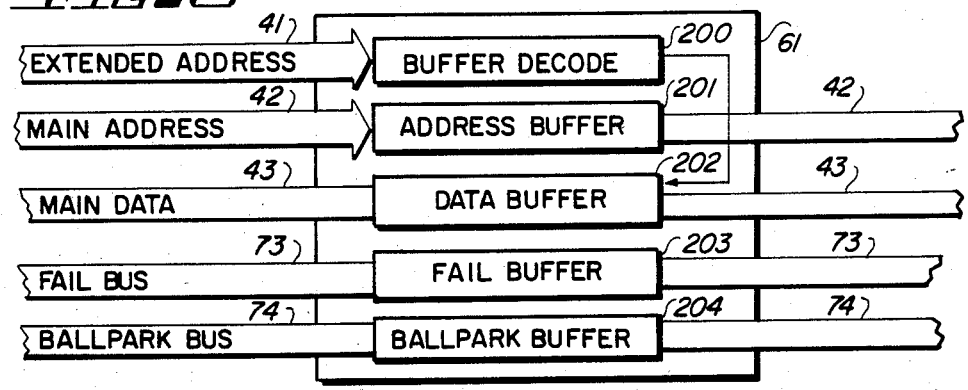
FIG. 8 is a detailed block diagram illustrating a spud buffer of FIG. 2.

FIG. 8 is a detailed block diagram of spud buffer 61 of FIG. 2. Spud buffer 61 comprises buffer decode 200, address buffer 201, data buffer 202, fail buffer 203 and ballpark buffer 204. Extended address bus 41 is connected to buffer decode 200 which, in turn, is connected to data buffer 202. Thus, extended address bus 41 controls which of the up to eight spuds data buffer 202 is connected to. Main address bus 42 passes through address buffer 201. Main data bus 43 passes through data buffer 202. Fail bus 73 passes through fail buffer 203. Ballpark bus 74 passes through ballpark buffer 204.

Figure 9:
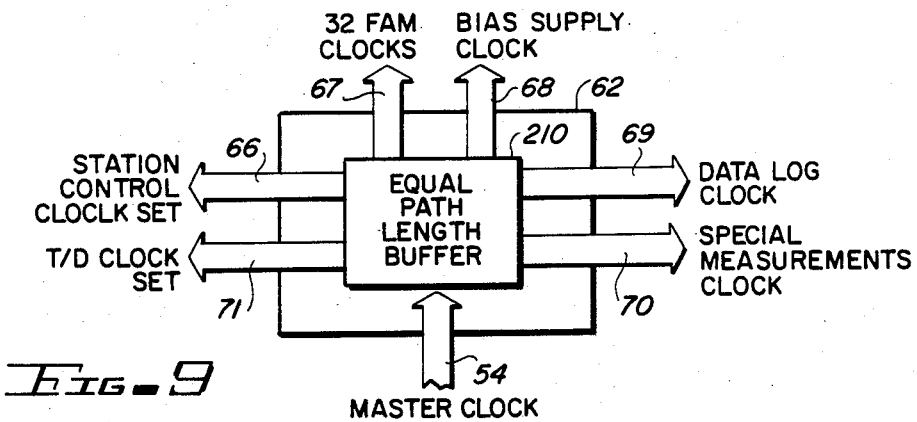
FIG. 9 is a detailed block diagram illustrating a clock buffer of FIG. 2.

FIG. 9 is a detailed block diagram of clock buffer 62 of FIG. 2. Master clock line 54 enters clock buffer 62 and is connected to equal path length buffer 210. Equal path length buffer 210 distributes the clock signals among the various subsystems while compensating for the different path lengths therebetween so as to synchronize the clock signals received by each. Equal path length buffer 210 distributes clock signals to time-to-digital clock set line 71, station control clock set line 66, 32 force and measure clocks 67, bias supply clock line 68, data log clock line 69 and special measurements clock line 70.

FIG. 10 is a detailed block diagram illustrating the force and measure circuitry of force and measure units 56 of FIG. 2. Each spud 50 contains 32 force and measure units 56, allowing the testing of parts having up to 32 pins. As more pins are encountered, more spuds 50 are added. State memory 215 contains the portion of state memory dedicated to force and measure units 56. State memory 215 is connected to main address bus 42 and main data bus 43. Clock line 67 brings clock signals from clock buffer 62 (FIG. 2.) and couples them to edge timing and control logic 216, strobe timing and control logic 217 and state memory 215.

Fail logic 218 is connected to fail bus 73 and ballpark bus 74 and to state memory 215. Data log logic 219 receives inputs from state memory 215, fail logic 218 and analog address bus 76 and provides output to log data bus 75.

A multiplexer 228 couples each force and measure unit 56 to one pin at each of up to four test heads. A force high voltage unit 220, a force high current unit 221, a force low voltage unit 222, a force low current unit 223, an AC driver 224, a parametric comparator 225, an AC parametric controller 226 and an AC comparator logic 227 are connected to multiplexer 228. State memory 215 provides inputs to force high voltage unit 220 force high current unit 221, force low voltage unit 222, force low current unit 223, AC driver 224, parametric comparator 225, AC parametric controller 226 and AC comparator logic 227. Edge timing and control 216 provides inputs to force high voltage unit 220, force high current unit 221, force low voltage unit 222, force low current unit 223 and AC driver 224. Strobe timing and control 217 provides inputs to parametric comparator 225 and AC parametric control 226. Analog data bus 77 provides inputs to force high voltage unit 220, force high current unit 221, force low voltage unit 222 and force low current unit 223.

Parametric comparator 225 provides an input to fail logic 218. AC parametric controller 226 provides another input to fail logic 218.

Force and measure unit 56 is substantially similar to prior art force and measure units. It contains the basic tools needed to perform DC parametric testing and AC testing. One difference between this unit and prior art force and measure units is that state memory 215 can set up all of the attached force and measure circuits based on the information in a single address in memory. Another aspect of the preferred embodiment is that the force and measure circuits are located remotely from the test heads. This aspect and its implementation are disclosed in co-pending application Ser. No. 656,810, filed Oct. 1, 1984, assigned to the assignee of the present invention.

The high and low range current and voltage forcing circuits, 220-223 are merely programmable current and voltage sources. The AC driver is similar to those used in all current AC testers. The DC parametric and AC comparators are alos similar to current testers and will be familiar to those skilled in the art.

Edge timing and control 216 applies programmed delays to the clock signals received on line 67 and determines when forcing conditions are to be applied to the device under test. Strobe timing and control performs a similar function to determine when measurements are to be made. The results of the measurements are passed from the DC parametric comparator 225 and AC parametric controller 226 to fail logic 218, which applies the appropriate signals to fail bus 73 and ballpark bus 74. Either fail logic 218 or state memory 215 may trigger data log logic 219 to request that a particular measurement be logged.

Figure 11:
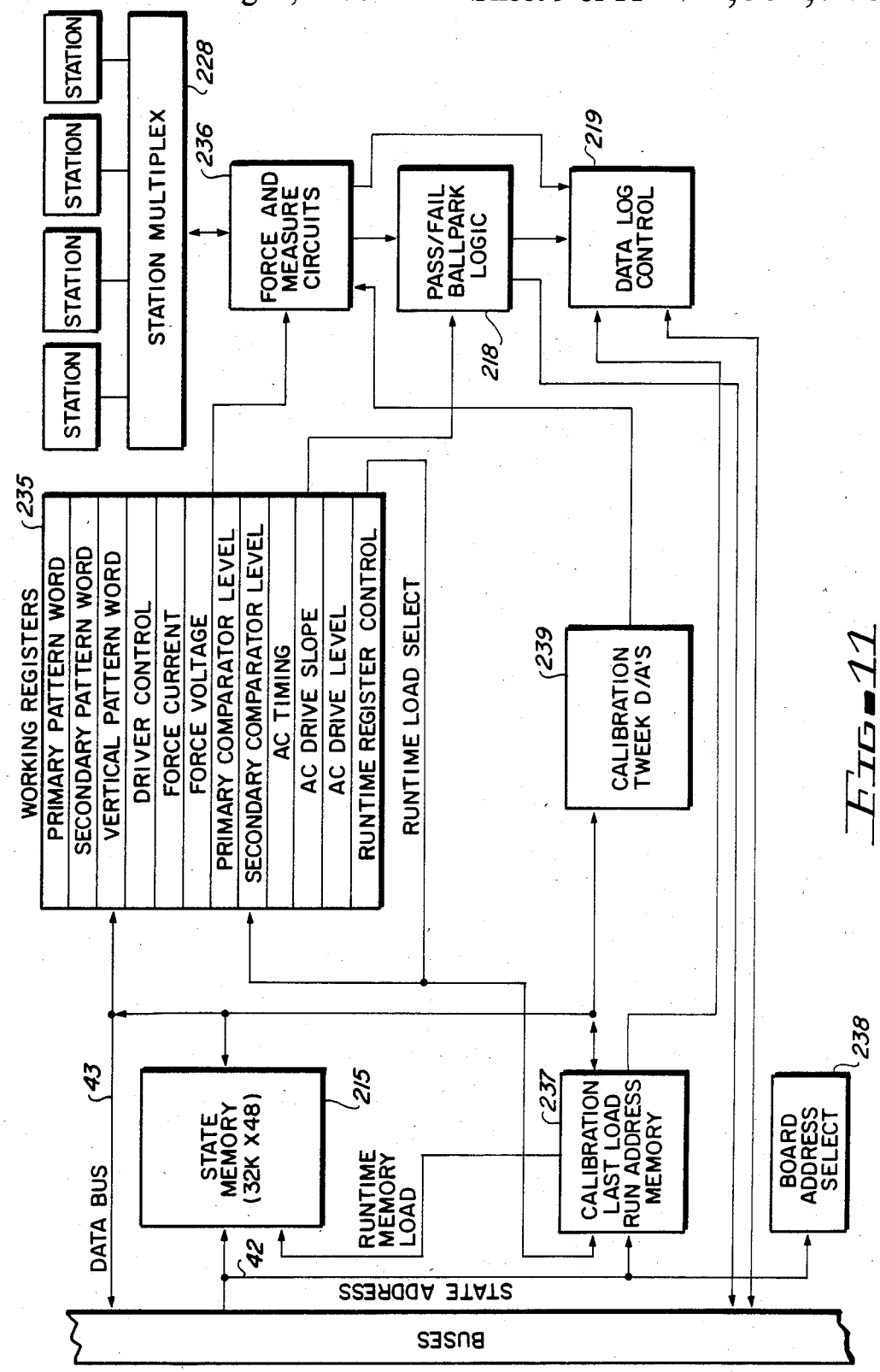
FIG. 11 is a detailed block diagram illustrating the control structure of the force and measure unit of FIG. 2.

FIG. 11 is a detailed block diagram illustrating the control structure of a force and measure unit 56. Main data bus 43 provides input to a set of working registers 235. Working registers 235 include a primary pattern word register, a secondary pattern word register, a vertical pattern word register, a driver control register, a force current register, a force voltage register, a primary comparator level register, a secondary comparator level register, an AC timing register, an AC drive slope register, an AC drive level register and a runtime register control. Working registers 235 provide input to force and measure circuit 236 and to pass/fail and ballpark logic 218. The data stored in working registers 235 serves to define the forcing conditions to be applied by the force and measure circuits and the measurement criteria to be applied in making pass/fail decisions.

An address in state memory 215 is, in the preferred embodiment, 48 bits long. The most significant four bits are used to address one of the twelve working registers 235. The remainder of each state memory word, or element, is used to specify the force values, timing, comparator values, data logging mode, and other necessary parameters. The vertical pattern word register is used when it is necessary to very quickly step through a number of force conditions, for instance when testing a microprocessor. In this mode of operation, thirty two bits of the vertical pattern word register are shifted through at a high rate. At each shift, a new condition is applied to the pin. This scheme allows very fast shifting between two or more test conditions at the pin without using a large number of state memory locations.

In addition to providing input to state memory 215, main address line 42 provide input to calibration and last load run address memory 237 and board address select 238. A set of calibration tweak digital-to-analog converters 239 is connected to force and measure circuits 236 to provide the capability of calibrating them during periods between tests. Calibration and last load run address memory 237 provides input to calibration tweak D-to-A converters 239.

Board address select 238 is addressed by the upper 4 bits of the state memory address, which are not used when testing, to identify input from the local computer, for instance when test routines are being loaded. This provides a means by which the local computer can load the state memory on each force and measure board individually.

Calibration and last load run address memory 237 serves two purposes. First, the calibration routines necessary to maintain the accuracy of force and measure circuits 236 are contained in memory 237. At the appropraite time, when no testing is occurring, these routines will be executed. The calibration tweak D-to-A's then are driven to calibrate force and measure circuits 236. Second, it is necessary when debugging test routines to know when each of the working registers 235 was last loaded. Memory 237 stores this information, allowing the test engineer to trace the execution of his test routine backwards and to identify a flaw in the loading of registers 235.

Figure 12:
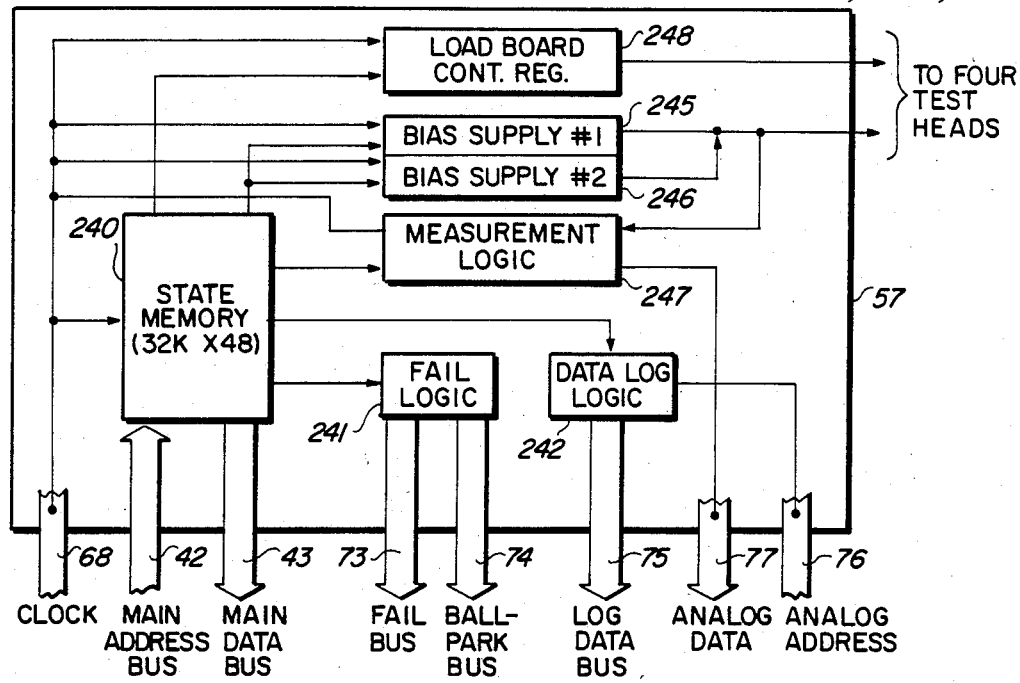
FIG. 12 is a detailed block diagram illustrating the bias supply of FIG. 2.

FIG. 12 is a detailed block diagram illustrating bias supply 57 of FIG. 2. State memory 240 contains the portion of state memory dedicated to bias supply 57.

State memory 240 is connected to main address bus 42 and main data bus 43. In addition, clock line 68 is connected to state memory 240.

State memory 240 provides an input to fail logic 241 which is connected to fail bus 73 and ballpark bus 74. State memory 240 also provides an input to data log logic 242 which is connected to log data bus 75. Analog address bus 76 is also connected to data log logic 242. A first bias supply 245 and a second bias supply 246 are connected to the four test heads and receive input from clock line 68 and state memory 240. Measurement logic 247 receives input from the four test heads, clock line 68 and state memory 240 and produces an output to analog data bus 77. A load board control register 248 receives inputs from clock line 68 and state memory 240 and is connected to the test heads.

Bias supplies 245 and 246 are programmed by state memory 240 to provide appropriate power supply for the part being tested. Measurement logic 247 determines whether those pins have responded properly to the application of power and supplies an analog measurement to analog data bus 77. Load board control register 248 is similar to load board registers 135 of FIG. 5.

Figure 13:
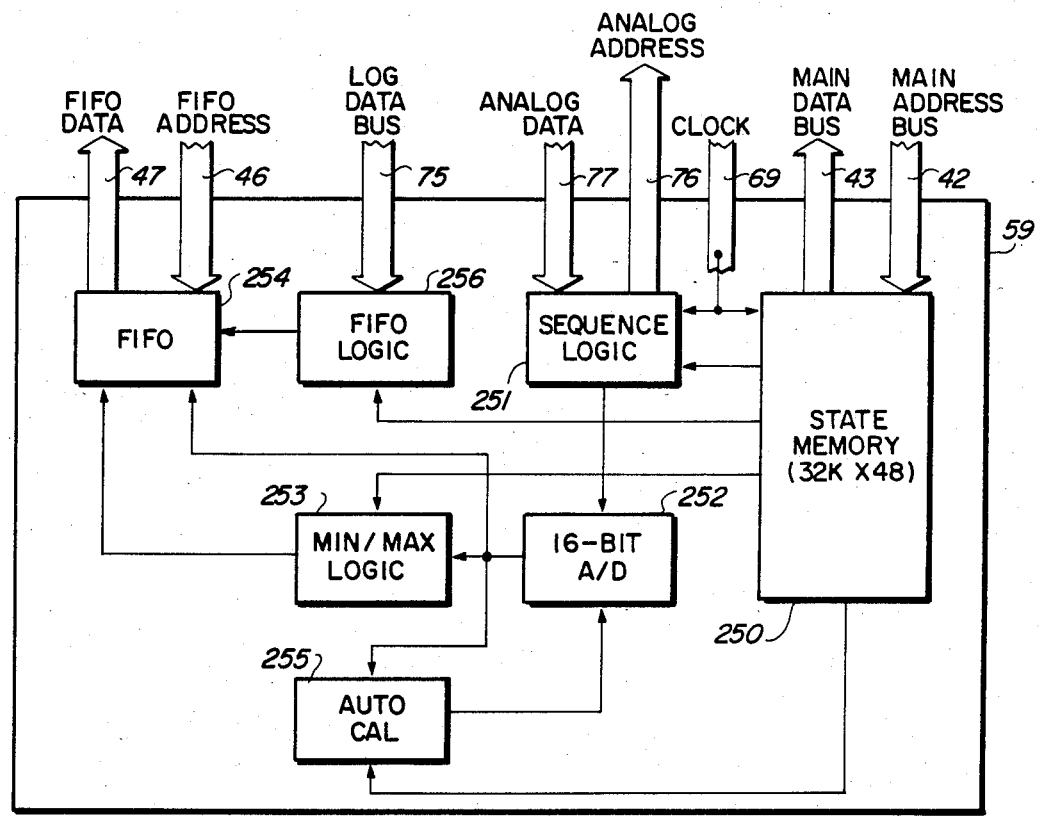
FIG. 13 is a detailed block diagram illustrating the data logging apparatus of FIG. 2.

FIG. 13 is a detailed block diagram illustrating data logging apparatus 59 of FIG. 2. State memory 250 contains the portion of state memory dedicated to data logging apparatus 59 and is connected to main address bus 42, main data bus 43 and clock line 69.

Sequence logic 251 is connected to analog address bus 76 and analog data bus 77. Sequence logic 251 receives inputs from state memory 250 and clock line 69 and has an output connected to 16 bit analog-to-digital converter 252. Min/Max logic 253 has inputs from state memory 250 and A-to-D converter 252 and has an output connected to FIFO memory structure 254. An autocalibration system 255 has inputs connected to state memory 250 and the output of A-to-D converter 252 and provides an input to A-to-D converter 252. FIFO logic 256 is connected to log data bus 75 and receives an input from state memory 250. FIFO logic 256 provides an input to FIFO memory structure 254. FIFO memory structure 254 is connected to FIFO address bus 46 and FIFO data bus 47.

Sequence logic 251 is responsible for determining the sequence in which data on analog data bus 77 are logged and for maintaining the identity of the data. Data are passed from sequence logic 251 to A-to-D converter 252, where they are converted to digital form. Auto calibration apparatus 255, driven by state memory 250, serves to maintain the precision of A-to-D converter 252. Data from A-to-D converter 252 are passed directly to FIFO memory structure 254 for output on FIFO data bus 47 and also to Min/Max logic 253. The output of Min/Max logic 253 is also passed to FIFO memory requests for data logging on log ta bus 75 and controls memeory structure 254.

Figure 14:
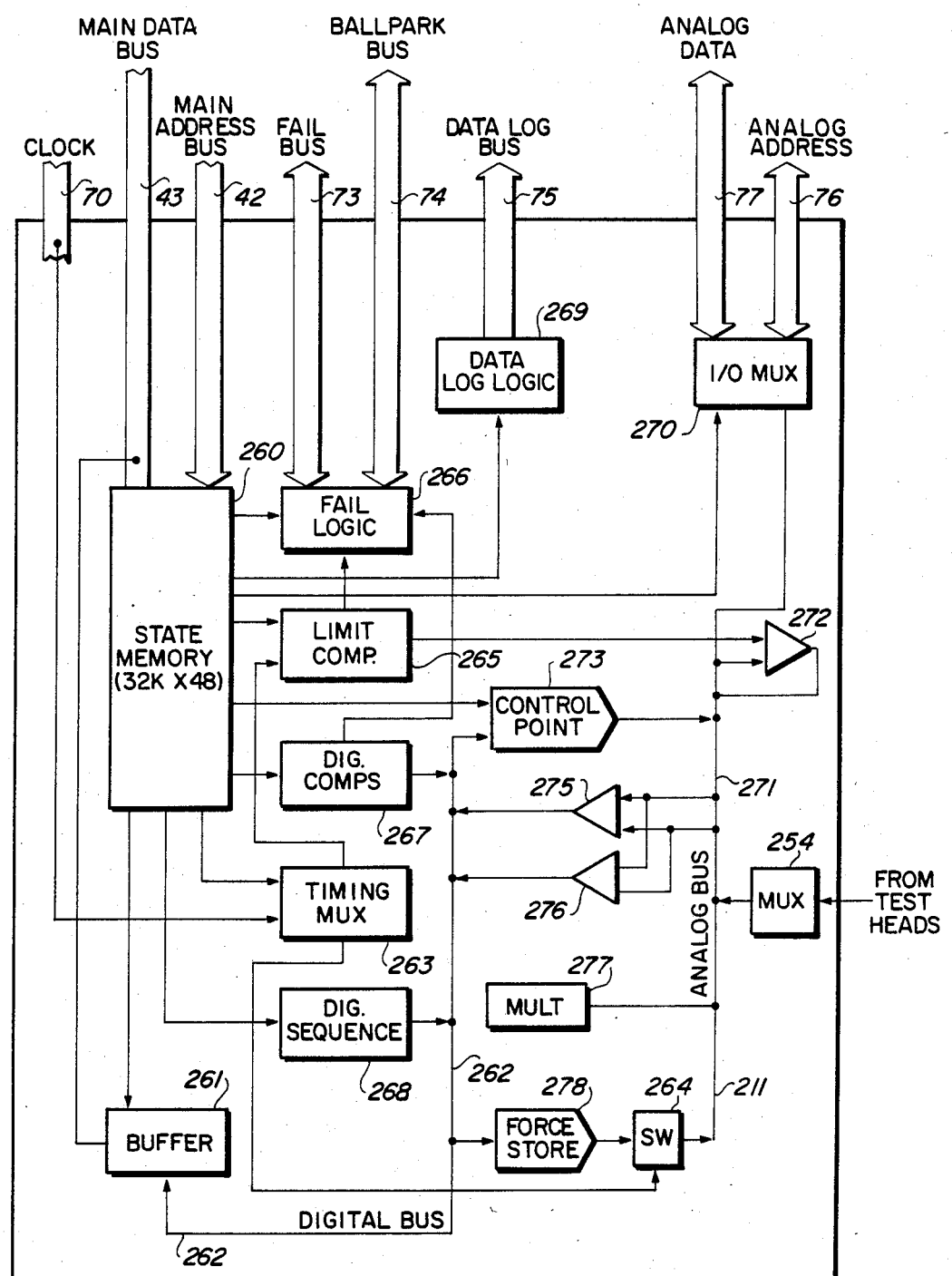
FIG. 14 is a detailed block diagram illustrating the special measurement apparatus of FIG. 2.

FIG. 14 is a detailed block diagram illustrating special measurements apparatus 58 of FIG. 2. Special measurements apparatus 58 is used for those measurements which are not well suited to the high speed architecture of the tester. It is also used as an area for expansion of the tester's capabilities. For that reason, special measurements apparatus 58 is highly customized to the needs of a particular installation and is subject to wide variation. State memory 260 contains that portion of state memory which is dedicated to special measurements board 58 and is connected to main address bus 42, main data bus 43 and clock line 70. Main data bus 43 is also connected to buffer 261, which has an input from state memory 260 and is connected to digital bus 262. Clock line 70 is connected to timing multiplexer 263. Timing multiplexer 263 provides inputs to switch 264 and limit comparator 265. Limit comparator 265 also has an input from state memory 260 and provides an input to fail logic 266. Fail logic 266 has an input from state memory 260 and an input from digital comparators 267. Fail logic 266 is connected to fail bus 73 and ballpark bus 74. Digital comparators 267 have an input from state memory 260 and are connected to digital bus 262. A digital sequencer 268 has an input from state memory 260 and is connected to digital bus 262.

Data log logic 269 has an input from state memory 260 and is connected to log data bus 75.

An I/O multiplexer 270 has an input from state memory 260 and is connected to analog address bus 76 and analog data bus 77. I/O multiplexer 270 is connected to analog bus 271.

Limit comparator 265 has an output connected to analog bus 271. A sum and difference amplifier 272 has inputs connected to analog bus 271 and an output connected to analog bus 271. A control point 273 has inputs connected to digital bus 262 and state memory 260 and an output connected to analog bus 271. A test multiplexer 274 has an input from the test heads and an output connected to analog bus 271. A first comparator 275 has inputs connected to analog bus 271 and an output connected to digital bus 262. Similarly, a second comparator 276 has inputs connected to the inputs of first comparator 275 and an output connected to digital bus 262. A multiplier 277 is connected to analog bus 271. A force store 278 has an input connected to digital bus 262 and an output connected to switch 264. The output of switch 264 is connected analog bus 271.

Utilization of the capabilities of special measurements apparatus 58 is under control of the test engineer through his programming of state memory. Typically, when apparatus 58 is to be used, an instruction is inserted in the state generator portion of state memory which inhibits generation of a new state address until the measurement is complete.

A prime function of special measurement apparatus 58 is run-time calibration. Any register or location in state memory may be altered via internal digital bus 262, which is coupled through buffer 261 to main data bus 43. In this mode of operation, an expected value is loaded into control point D-to-A converter 273; an analog value from the point being calibrated is routed through I/O multiplexer 270 onto internal analog bus 271; and one of comparators 275 and 276 is used to compare the expected to the actual value. In this manner, a digital chop, or successive approximation, method may be employed to calibrate any control register or state memory location in the tester.

In the cases of those portions of the apparatus not having an analog output path, a portion of fail bus 73 is used to bring the result of a comparison at the location being calibrated back to digital comparators 267 to complete the calibration loop.

Control Point 273 is a highly accurate D-to-A converter and is considered the standard for the entire tester. A time from the test heads is provided through multiplexer 274 so that the value on internal analog bus 271 may be viewed for purposes of setting up control point 273.

By now it should be apparent that an improved integrated circuit tester is provided by the present invention. The architecture of the present invention allows very high speed testing to be accomplished by removing the limitation of the communication speed between a management computer and the force and measure circuits. A state machine concept is used to render testing autonomous of the local computer, which merely monitors progress, reports status and logs data.

While the present invention has been shown and described with regard to a particular embodiment thereof, various modifications and changes will be apparent to one skilled in the art.

We claim:

1. An apparatus for testing at least one electronic device having a predetermined number of pins comprising:
   a state memory having a plurality of memory locations, each of said locations containing a frame comprising a number of elements greater than said predetermined number of pins;
   a number of force and measure units coupled to said state memory and to said pins, said number of force and measure units being greater than or equal to said predetermined number of pins, each of said force and measure units being responsive to a predetermined element of each frame in said state memory; and
   state generator means for providing addresses to said state memory, said state generator means being responsive to a test program stored in at least one element of each frame of said state memory.

2. An apparatus according to claim 1 further comprising:
   station control means coupled to said state generator and said force and measure units receiving indications therefrom and to said state generator for controlling branching thereof.

3. An apparatus according to claim 2 further comprising:
   device handler means coupled to said station control means for inserting devices to be tested into a test head and for placing tested devices into one of said at least two bins.

4. An apparatus according to claim 1 further comprising:
   general purpose computer means for loading said state memory and receiving test data.

5. An apparatus according to claim 1 further comprising:
   data logging means coupled to said force and measure units for receiving test data therefrom.

6. An apparatus according to claim 5 wherein:
   said force and measure units are capable of providing pass/fail and near pass/fail indications only; and
   said data logging means is capable of providing digitized measurements of selected test results.

7. An apparatus for testing electronic devices having pins comprising:
   a force and measure unit adapted to be coupled to each pin of said electronic device;
   a state memory having a plurality of memory locations, each said location being capable of storing sufficient information to drive each said force and measure unit to at least one state, said plurality of locations being sufficient to contain an entire test pattern; and
   state generator means responsive to a test program stored in said memory for providing addresses to said state memory.

8. An apparatus according to claim 7 further comprising:
   station control means coupled to said force and measure units, said state memory and said state generator, said force and measure units providing pass/fail indications to said station control means, said station control means responding to said pass/fail indications and contents of said state memory to control branching of said state generator and to segregate said devices into at least two categories.

9. An apparatus according to claim 7 further comprising:
   data logging means coupled to said force and measure units to receive analog measurements therefrom and to produce digitized results thereof.

10. An apparatus according to claim 9 further comprising:
    general purpose computer means coupled to said state memory for the loading thereof and to said data logging means for receiving said digitized results therefrom.

11. An apparatus according to claim 7 further comprising:
    means coupled to said force and measure units and said state memory for selectively receiving analog measurements from said force and measure units and for performing tests under control of said state memory.

12. An automated electronic device tester comprising:
    a plurality of force and measure units, each said force and measure unit being dedicated to a single pin of a device under test, each said force and measure unit being capable of forcing high or low current and high or low voltage to said pin and measuring a response of said pin, said force and measure units providing pass/fail indications;
    a state memory coupled to said force and measure units, said state memory containing, at a single address, information sufficient to define a state of each of said force and measure units, said state memory having a number of addresses sufficient to contain an entire test routine for at least one electronic device;
    state generator couple to said state memory, said state generator being responsive to contents of said state memory to provide addresses to said state memory; and
    station controller coupled to said state memory, said force and measure units and to said state generator, said station controller responding to said pass/fail indications, controlling branching of said state generator and controlling handling of electronic devices.

13. An automated tester according to claim 12 further comprising:
    a general purpose computer coupled to said state memory.

14. An automated tester according to claim 13 further comprising:
    a data logging apparatus coupled to said force and measure units and to said general purpose computer, said data logging apparatus providing digitized results of selected measurements to said general purpose computer.

15. An automated tester according to claim 12 further comprising:
a special measurement apparatus coupled to said force and measure units, said state memory and said state generator, said special measurement apparatus stalling said state generator while performing tests.

16. A method of testing an electronic device comprising the steps of:
coupling each pin of said device to a force and measure unit;
operating a state generator to provide addresses according to a test program;
for each said address, providing information from a state memory to define at least one state of each of said force and measure units, said state memory containing at least one entire test routine.

17. A method according to claim 16 further comprising the steps of:
for each said at least one state of said force and measure units, applying predetermined forcing conditions to at least one pin of said device, measuring a response of at least one pin of said device and applying pass/fail criteria thereto to generate a least one pass/fail indication.

18. A method according to claim 17 further comprising the step of:
utilizing said at least one pass/fail indication to control branching of said state generator.

19. A method according to claim 17 further comprising the steps of:
digitizing selected ones of said measured responses; and
collecting said digitized responses with a general purpose computer.

20. A method according to claim 16 further comprising the steps of:
halting, under control of said state memory, operation of said state generator;
performing at least one special test on at least one of said pins; and
applying pass/fail criteria to results of said at least one special test.

21. A method of testing electronic devices comprising the steps of:
loading a state memory with a test routine, said test routine comprising a plurality of frames, each of said frames comprising a plurality of force and measure portions, a state generator portion and station control portion;
operating a state generator under control of said state generator portions to provide addresses to said state memory;
for each address so provided, locating a corresponding frame in said state memory, providing the plurality of a force and measure portions thereof to a like plurality of force and measure units, providing the state generator portions thereof to said state generator and providing the station control portions thereof to a station control;
operating said force and measure units to measure a response of at least one pin of a device under test to a force condition and to apply pass/fail criteria thereto and
operating said station control in response to said station control portion and to pass/fail indications from said force and measure units to control branching of said state generator and to categorize said device under test into one of a least two categories.

22. A method according to claim 21 further comprising the step of:
digitizing selected ones of said meausured responses.

23. A method according to claim 21 further comprising the steps of:
halting, under control of a special measurement portion of a frame of said state memory, operation of said state generator;
performing at least one of special test on at least one of said pins; and
applying pass/fail criteria to results of said at least one special test.

* * * * *